United States Patent [19]
Hong et al.

[11] Patent Number: 5,962,883
[45] Date of Patent: Oct. 5, 1999

[54] ARTICLE COMPRISING AN OXIDE LAYER ON A GAAS-BASED SEMICONDUCTOR BODY

[75] Inventors: Minghwei Hong; Jueinai Raynien Kwo, both of Watchung; Donald Winslow Murphy, Green Brook, all of N.J.

[73] Assignee: Lucent Technologies Inc., Murray Hill, N.J.

[21] Appl. No.: 09/093,557

[22] Filed: Jun. 8, 1998

Related U.S. Application Data

[63] Continuation-in-part of application No. 08/741,010, Oct. 31, 1996, abandoned, which is a continuation-in-part of application No. 08/408,678, Mar. 22, 1995, Pat. No. 5,821,171, which is a continuation-in-part of application No. 08/217,332, Mar. 23, 1994, Pat. No. 5,550,089.

[51] Int. Cl.$^6$ ..................................................... H01L 29/76
[52] U.S. Cl. ............................ 257/289; 257/410; 257/411
[58] Field of Search .................................. 257/411, 410, 257/289

[56] References Cited

U.S. PATENT DOCUMENTS

| | | | |
|---|---|---|---|
| 4,749,255 | 6/1988 | Chakrabarti et al. | 350/164 |
| 4,859,253 | 8/1989 | Buchanan et al. | 148/33.3 |
| 5,055,445 | 10/1991 | Belt et al. | 505/1 |
| 5,451,548 | 9/1995 | Hunt et al. | 437/225 |
| 5,550,089 | 8/1996 | Dutta et al. | 437/225 |
| 5,597,768 | 1/1997 | Passlack | 437/236 |
| 5,821,171 | 10/1998 | Hong et al. | 438/767 |

FOREIGN PATENT DOCUMENTS 410242465  9/1998  Japan .

OTHER PUBLICATIONS

"Status of the GaAs Metal–Oxide–Semiconductor Technology", by T. Mimura, *IEEE Transactions on Electron Devices*, vol. ED–27, No. 6, Jun. 1980, pp. 1147–1155.

"Improved Enhancement/Depletion GaAs MOSFET Using Anodic Oxide as the Gate Insulator", by A. Colquhoun et al., *IEEE Transactions on Electron Devices*, vol. ED–25, No. 3, Mar. 1978, pp. 375–376.

"Thermal–Oxide Gate GaAs MOSFET's", by H. Takagi, *IEEE Transactions on Electron Devices*, vol. ED–25, No. 5, May 1978, pp. 551–552.

"Thermodynamic and Photochemical Stability of Low Interface State Density $Ga_2O_3$–GaAs Structures Fabricted by in situ Molecular Beam Epitaxy", by M. Passlack et al., *Applied Physics Letters*, vol. 69 (3), Jul. 15, 1996, pp. 302–304.

Quasistatic and High Frequency Capacitance–Voltage Characterization of $Ga_2O_3$–GaAs Structures Fabricated by in situ Molecular Beam Epitaxy, by M. Passlack et al., *Applied Physics Letters*, vol. 68 (8), Feb. 19, 1996, pp. 1099–1101.

"Low Interface State Density Oxide–GaAs Structures Fabricated by in situ Molecular Beam Epitaxy", by M. Hong et al., *J. Vac. Sci. Technol. B*, vol. 14 (3), May/Jun. 1996, pp. 2297–2300.

(List continued on next page.)

*Primary Examiner*—William Mintel
*Attorney, Agent, or Firm*—Eugen E. Pacher

[57] ABSTRACT

Disclosed are articles that comprise an oxide layer on a GaAs-based semiconductor body, with metal layers on the oxide and the body facilitating application of an electric field across the oxide layer. The interface between the oxide and the semiconductor body is of device quality. Contrary to teachings of the prior art, the oxide is not essentially pure $Ga_2O_3$, but instead has composition $Ga_xA_yO_z$, where A is an electropositive stabilizer element adapted for stabilizing Ga in the 3+ oxidation state. Furthermore, $x \geq 0$, z is selected to satisfy the requirement that both Ga and A is substantially fully oxidized and $y/(x+y)$ is greater than 0.1. Stabilizer element A typically is selected from Sc, Y, the rare earth elements and the alkaline earth elements. Articles according to the invention exemplarily comprise a planar enchancement mode MOS-FET with inversion channel. A method of making articles as described above is also disclosed.

9 Claims, 10 Drawing Sheets

OTHER PUBLICATIONS

"Investigation of the Mechanism for Schottky Barrier Formation by Group III Metals on GaAs (110)", by P. Skeath, *J. Vac. Sci. Technol.,* vol. 16 (5), Sep/Oct. 1979, pp. 1143–1148.

"Unified Defect Model and Beyond", by W. E. spicer, *J. Vac. Sci. Technol.*, 17 (5), Sep./Oct. 1980, pp. 1019–1027.

"Determination of the Oxygen Binding Site on GaAs (110) Using Soft–X–Ray–Photoemission Spectroscopy", by P. Pianetta et al., *Physical Review Letters,* vol. 35, No. 20, Nov. 17, 1975, pp. 1356–1359.

"Physics of Secmiconductor Devices", by S. M. Sze, John Wiley & Sons, p. 366, New York 1981.

"An Investigation of Surface States at a Silicon/Silicon Oxide Interface Employing Metal–Oxide–Silicon Diodes", by L. M. Terman, *Solid–State Electronics*, Pergamon Press 1962, vol. 5, pp. 285–299, 1962.

"In–Situ Process for AIGaAs Compound Semiconductor: Materials Science and Device Fabrication", by M. Hong et al., *Journal of Electronic Materials*, vol. 23, No. 7, 1994, pp. 625–634.

ARTICLE COMPRISING AN OXIDE LAYER ON A GAAS-BASED SEMICONDUCTOR BODY

CROSS REFERENCE TO RELATED APPLICATION

This application is a continuation-in-part of U.S. patent application Ser. No. 08/741,010, filed Oct. 31, 1996, now abandoned which is a continuation-in-part of U.S. patent application Ser. No. 08/408,678, filed Mar. 22, 1995, now U.S. Pat. No. 5,821,171, which is a continuation-in-part of U.S. patent application Ser. No. 08/217,332, filed Mar. 23, 1994, now U.S. Pat. No. 5,550,089.

TECHNICAL FIELD

This invention pertains to articles that comprise an oxide layer on a GaAs-based semiconductor body, e.g., a field effect transistor (FET), and to methods of making such articles.

BACKGROUND OF THE INVENTION

GaAs-based transistors and circuits are widely used in, for instance, wireless communication apparatus, due inter alia to the relatively high electron mobility in GaAs, the availability of semi-insulating GaAs substrates, and the relative simplicity of manufacturing processes.

Si-based metal oxide semiconductor (MOS) field effect transistors (FETs) are known, and are widely used. Among the advantages of Si-based MOS-FETs are simplicity, low power and low cost. The most common Si-based MOS-FET is the enhancement-type MOS-FET, which is "normally off" with zero gate voltage.

As is well known, an important factor in Si MOS-FET technology is the ease with which a high quality stable and controllable silicon oxide layer can be formed on the conventional (100) surface of a Si wafer. This includes a very low (e.g., $10^{10}$ cm$^{-2}$eV$^{-1}$ or less) surface state density at the Si/silicon oxide interface.

Much effort has been directed towards GaAs-based MOS-FETs. See, for instance, T. Mimura et al., *IEEE Transactions on Electron Devices*, Vol. ED-27(6), p. 1147 (June 1980) for a review of early work. The authors of that paper concluded (p. 1154) that, although the main features of the results achieved so far are promising, " . . . some technological problems remain, including anomalous behavior of the dc and low-frequency operation of the devices. Undoubtedly, these problems are associated with the high density of surface states involved in the GaAs MOS system." See also A. Colquhoun et al., *IEEE Transactions on Electron Devices*, Vol. ED 25(3), p. 375 (March 1978), and H. Takagi et al., *IEEE Transactions on Electron Devices*, Vol. ED 25 (5), p. 551 (May 1978). The former discloses a device that comprises an etched notch that defines the channel thickness. Such a non-planar structure would be relatively difficult to make repeatably, and thus is less desirable than a planar MOS-FET would be.

As pointed out by Mimura et al., the early devices suffered from poor gate oxide/GaAs interface quality, including a high density of interface states. In recent years, substantial effort has been directed at this problem.

For instance, U.S. Pat. No. 5,451,548 discloses formation of a $Ga_2O_3$ film on GaAs by e-beam evaporation from a high purity single crystal of $Gd_3Ga_5O_{12}$. See also U.S. Pat. No. 5,550,089, and U.S. patent application Ser. No. 08/408,678 U.S. Pat. No. 5,821,171 (respectively grandparent and parent of this CIP application, incorporated herein by reference), which disclose GaAs/$Ga_2O_3$ structures with mid-gap interface state density below $10^{11}$ cm$^{-2}$eV$^{-1}$. See also M. Passlack et al., *Applied Physics Letters*, Vol. 69(3), p. 302 (July 1996) which reports on the thermodynamic and photochemical stability of low interface state density GaAs/$Ga_2O_3$/$SiO_2$ structures that were fabricated using in situ molecular beam epitaxy. Other pertinent publications are M. Passlack et al., *Applied Physics Letters*, Vol. 68(8), p. 1099 (February 1996); and M. Hong et al., *J. of Vacuum Science and Technology B*, Vol. 14(3), p. 2297, (May/June 1996).

However, despite the extensive effort by many researchers over many years, and the resulting large number of publications, to date it has not been possible, to the best of our knowledge, to fabricate GaAs-based MOS-FETs that can meet commercial requirements. Specifically, despite the successful formation of high quality, low interface state density GaAs/$Ga_2O_3$ test structures, it has apparently not yet been possible to devise a process of making a GaAs MOS-FET (including enhancement-type MOS-FETs) that can preserve the interface quality to the extent that an inversion layer can be formed at the semiconductor/gate oxide interface of an actual MOS-FET.

In the absence of an acceptable GaAs-based MOS-FET technology, GaAs-based integrated circuits for instance require double supply voltages and have relatively high power consumption, resulting in turn in relatively short battery lifetime and requiring relatively complex circuitry in, for instance, battery-powered personal communication devices. Such ICs are of limited usefulness.

In view of the significant advantages that would attend availability of commercially acceptable GaAs-based MOS-FETs, it would be highly desirable to have available such devices, especially enhancement mode (normally "off") MOS-FETs. This application discloses such devices. It also discloses an exemplary process of making such devices that provides low gate oxide/semiconductor interface state density, and can preserve this low state density throughout the subsequent processing steps.

SUMMARY OF THE INVENTION

An ancestor of this CIP application exemplarily discloses optoelectronic III-V semiconductor device comprising a thin film coating with proper optical characteristics providing low midgap interface state density. It also discloses a field effect device for inversion, depletion or accumulation channel applications on III-V semiconductors comprising a thin dielectric film providing required interface characteristics. It also discloses that the thin film is applicable to passivation of states on exposed surfaces of electronic III-V devices. The thin film comprises a $Ga_2O_3$ dielectric thin film, exemplarily fabricated by electron-beam evaporation of a single crystal, high purity $Gd_3Ga_5O_{12}$ complex compound on substrates kept at a temperature within a range of from 40 to 370° C. and at background pressures at or above $1 \times 10^{-10}$ Torr.

The ancestor of this CIP application discloses a method of making an article that comprises a GaAs-based (e.g., GaAs or a ternary or quaternary III-V alloy that comprises Ga and As) semiconductor body having a major surface, and that further comprises a layer of dielectric material disposed on the major surface. At least at the semiconductor/dielectric interface the dielectric material consists essentially of $Ga_2O_3$. The method comprises providing the semiconductor body, and forming the layer of dielectric material on the major surface, said forming comprising completion (at time $t_m$) of a first monolayer of the dielectric material on the major surface.

Significantly, the major surface is prepared (e.g., by MBE growth of a semiconductor layer on a substrate body, and/or by appropriate cleaning or cleaving in UHV) such that, at a given point ($t_c$) in time the major surface is substantially atomically clean. Herein, a non-(100) on non-(111) surface (e.g., (110)) is considered to be "substantially atomically clean" if the Fermi level at the surface can be moved freely to any energy within the bandgap. Whether or not the Fermi level at the surface is free to move can be determined, in situ, by a known method, namely, photoemission spectroscopy. See, for instance, P. Skeath et al., *J. Vacuum Science and Technology*, Vol. 16, 1143 (1979), and W. E. Spicer et al., *J. Vac. Science and Technology,* Vol. 17(5), p. 1019 (1980). The above condition typically cannot be applied to a (100)-surface. Thus, a (100)-oriented surface is considered to be "substantially atomically clean" if surface coverage by impurity atoms is less than (typically substantially less than) 1% of a monolayer, preferably less than 0.1% of a monolayer. The degree of coverage by impurity atoms can be measured by a known technique (XPS). See, for instance, P. Pianetta et al., *Phys. Rev. Letters*, Vol. 35 (20), p. 1356 (1975).

Furthermore, at least during the period from $t_c$ to $t_m$, the semiconductor body is maintained in a reduced pressure atmosphere (typically UHV), the conditions (time, pressure, temperature, etc.) selected such that, at time $t=t_m$, the coverage of the surface with impurity atoms is less than 1% of a monolayer. Exemplarily, this condition is typically met if the pressure p(t) is selected such that $$\int_{t_c}^{t_m} p(t)dt$$

is at most 100 Langmuir. A "Langmuir" is a conventional measure of surface exposure, namely $1\times10^{-6}$ Torr.seconds. In preferred embodiments the value of the integral is less than 50, even less than 10 Langmuir. It will be appreciated that p(t) is the pressure due to impurity species such as $O_2$, CO, $H_2O$, and does not include the pressure due to growth species or surface stabilizers such as As.

GaAs-based semiconductor/$Ga_2O_3$ interfaces formed as described not only can have very low density of interface states (exemplarily <$10^{11}$/$cm^2$.eV) and low surface recombination velocity (exemplarily <$10^4$ cm/s), with inversion observed in both n-type and p-type material, but also have high thermochemical and photochemical stability. These values pertain to room temperature (20° C.). All of these advantageous properties are observed on (100)-oriented interfaces, and thus are directly applicable to electronic devices such as MOS-FETs, HBTs and solar cells, as well as to opto-electronic devices such as lasers, LEDs and detectors. The approach however is not limited to (100)-oriented surfaces.

A further ancestor of this CIP application discloses an article (e.g., an IC, or a personal communication device that comprises the IC) that comprises a GaAs-based MOS-FET having improved characteristics, including a low gate oxide/semiconductor midgap interface state density.

More specifically, the ancestor discloses an article that comprises a GaAs-based MOS-FET comprising a GaAs substrate having a major surface, two spaced apart regions of a first conductivity type extending from the major surface into the substrate (designated "source" and "drain, respectively), a metal contact disposed on each of said source and drain, with an oxide layer (designated "gate oxide") disposed on the major surface between the source and the drain, and with a gate metal contact disposed on the gate oxide layer.

Significantly, the MOS-FET is a planar device (i.e., the semiconductor surface is planar, without etched recesses or epitaxial regrowth), the source and drain regions extend into GaAs material of a second conductivity type, the gate oxide layer comprises (typically substantially consists of) $Ga_2O_3$, associated with the gate oxide/semiconductor interface is a midgap interface state density of at most $5\times10^{10}$ $cm^{-2}eV^{-1}$, and the MOS-FET is an enhancement mode MOS-FET adapted for forming a first conductivity type channel between source and drain upon application of a voltage to the gate metal contact.

A MOS-FET as described comprises a gate oxide of the type described in the grandparent application of this CIP application. In preferred embodiments the gate metal contact is disposed directly on the gate oxide layer, without cap layer (e.g., $SiO_2$) between the gate oxide and the gate metal contact. Another preferred embodiment comprises complementary MOS-FETs according to the invention disposed on a common substrate with both types being planar devices (without etched recesses or epitaxial regrowth), and/or comprises MOS-FETs according to the invention and MES-FETs on a common substrate.

Although the prior art teaches a technique for making $Ga_2O_3$/GaAs test structures with low interface state density, it had generally not been possible to preserve the low interface state density through subsequent processing steps required to form a practical MOS-FET. Thus, a significant aspect of the disclosure is the development of a method of making a GaAs-based MOS-FET that can not only achieve but also preserve a low interface state density.

The ancestor discloses a method of making an article that comprises a GaAs-based enchancement mode MOS-FET having improved properties, including low gate oxide/semiconductor midgap interface state density. Significant aspects of the method are in situ surface reconstruction prior to gate oxide deposition, and a step sequence arranged such that, at least in preferred embodiments, no high temperature (typically >300° C.) steps are carried out after gate oxide deposition. The method can be readily adapted for manufacture of complementary MOS-FETs on a common substrate, and/or for manufacture of MOS-FETs and MES-FETs on a common substrate.

As will be described in detail below, this continuation-in-part application discloses articles comprising a novel dielectric layer on GaAs-based semiconductors, and a method of making the article.

More specifically, the article comprises an oxide layer on a GaAs-based semiconductor body, and forming an interface therewith. The article further comprises a metal contact disposed on each of the oxide layer and the semiconductor body. Associated with the interface is a midgap interface state density of at most $1\times10^{11}$ $cm^{-2}eV^{-1}$ at 20° C.

Significantly, the oxide layer has overall composition $Ga_xA_yO_z$, where Ga substantially is in a 3+ oxidation state, where A is one or more electropositive stabilizer element for stabilizing Ga in the 3+ oxidation state, x is greater than or equal to zero, y/(x+y) is greater than or equal to 0.1, and z is sufficient to satisfy the requirement that Ga and A are substantially fully oxidized. Herein, Ga and A each are considered to be "substantially fully oxidized" if at least 80% (preferably at least 90%) of the respective element is fully oxidized, i.e., is in the highest oxidation state of the element. The highest oxidation state of Ga is 3+. The highest oxidation state of A depends on A. For instance, if A is an alkaline earth, then the state is 2+, and if A is Sc, Y, or a rare earth element, then the state is frequently, but not always, 3+.

The method of making the article comprises the steps of providing the GaAs-based semiconductor body, treating the body such that at least a portion of a major surface of the body is essentially atomically clean and essentially atomically ordered, forming, substantially without exposure of the semiconductor body to contamination, the oxide layer on the essentially atomically clean and ordered surface, and forming the metal contacts.

Significantly, the first forming step comprises forming the oxide layer such that the oxide layer has overall composition $Ga_xA_yO_z$, where Ga substantially is in a 3+ ionization state, where A is one or more electropositive stabilizer element for stabilizing Ga in the 3+ ionization state, x is greater than or equal to zero, y/(x+y) is greater than or equal to 0.1, and z is sufficient to satisfy the requirement that Ga and A are substantially fully oxidized.

In an exemplary embodiment of the article, the oxide contains both Ga and A, and the stabilizer element A is Sc, Y or a rare earth (atomic number 57-71) element. In another exemplary embodiment the oxide layer is an essentially Ga-free oxide of a stabilizer element.

In an exemplary embodiment of the method the oxide layer is formed by simultaneous deposition from two (or possibly more) deposition sources, with one of the sources containing $Ga_2O_3$ (typically in powder form), and the other containing an oxide of a stabilizer element (e.g., $Gd_2O_3$), typically also in powder from. In another exemplary embodiment the oxide layer is formed by deposition from a single deposition source containing an oxide of a stabilizer element, e.g., $Gd_2O_3$.

BRIEF DESCRIPTION OF THE DRAWING'S

Figure 8:
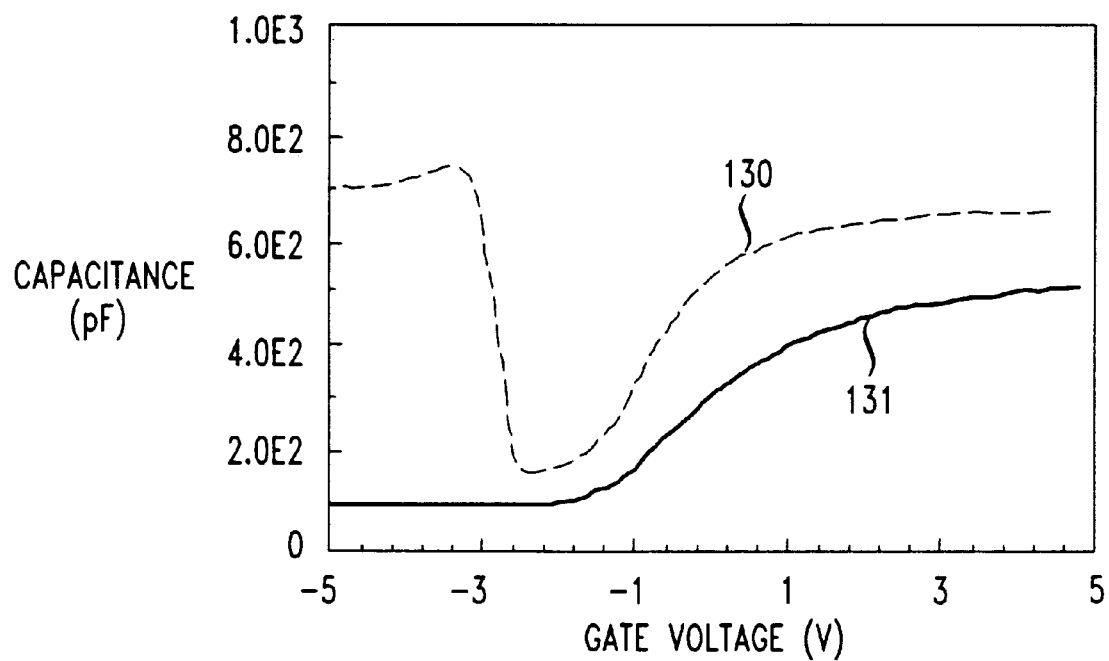
Figure 9:
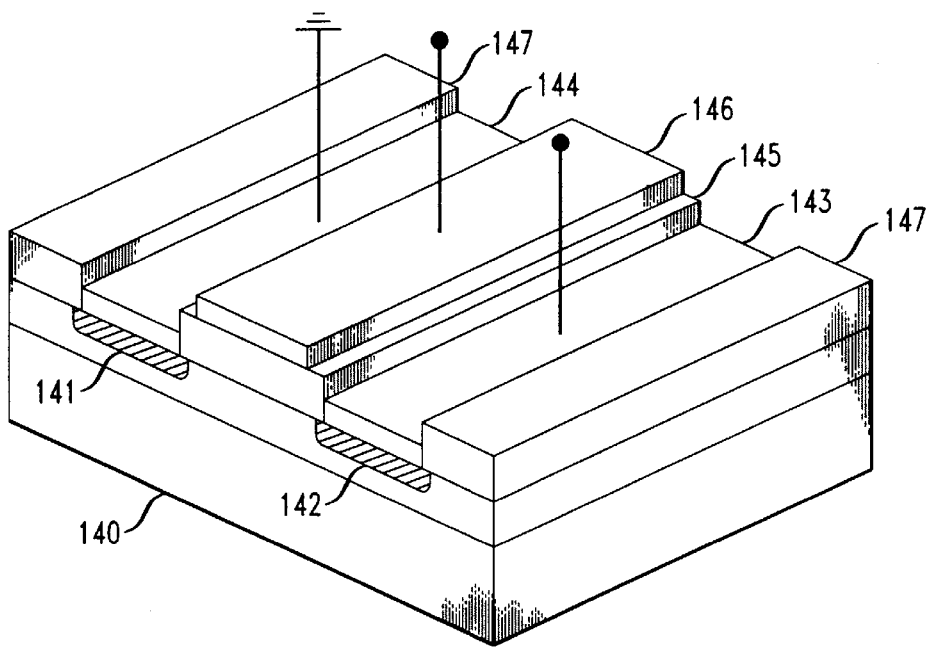
Figure 10:
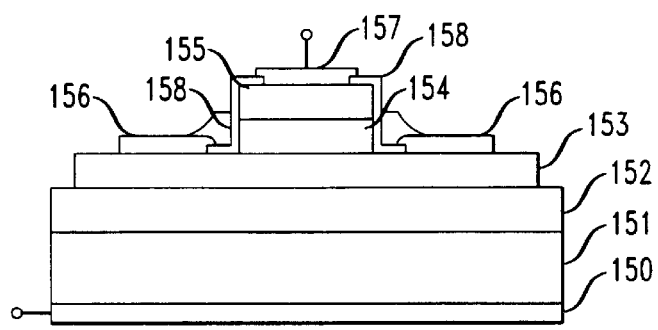
Figure 11:
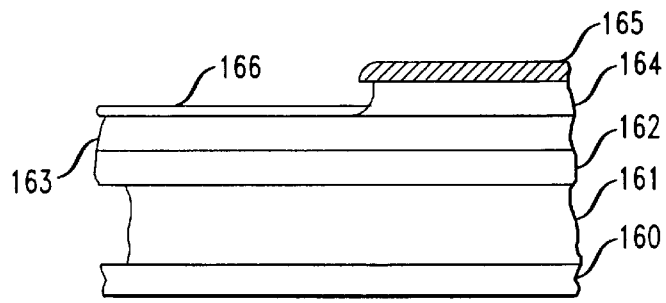
Figure 12:
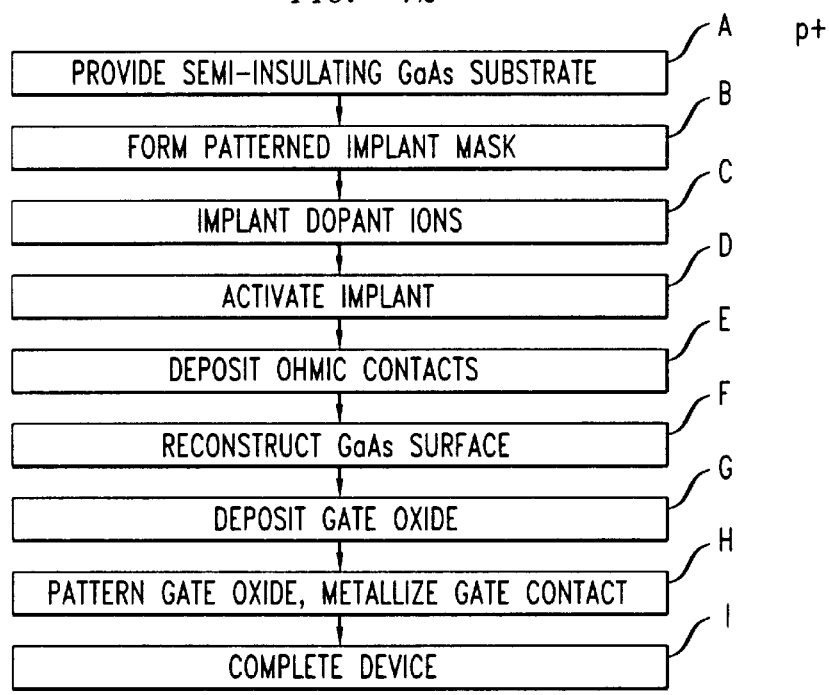
Figure 18:
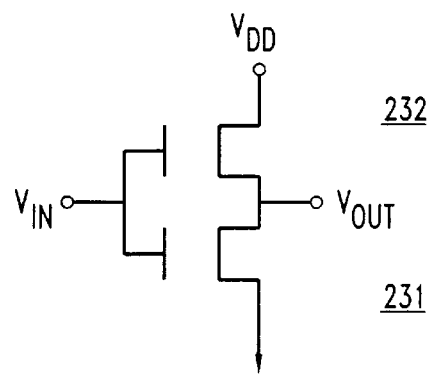
Figure 19:
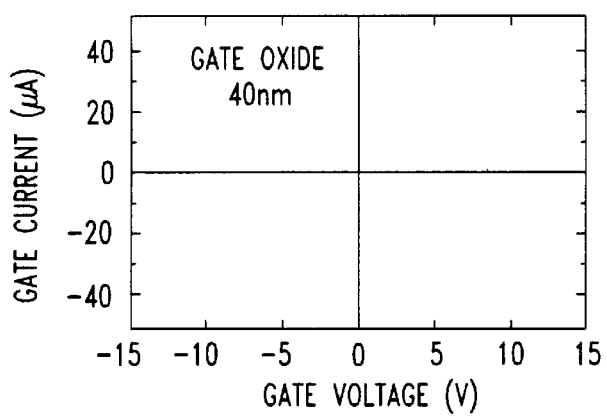
Figure 20:
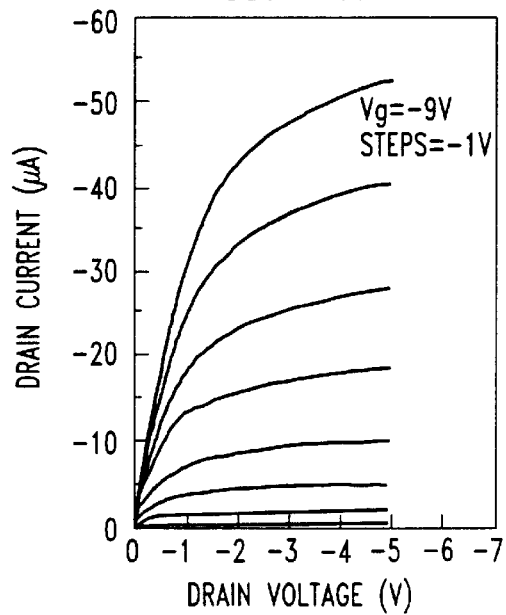
Figure 21:
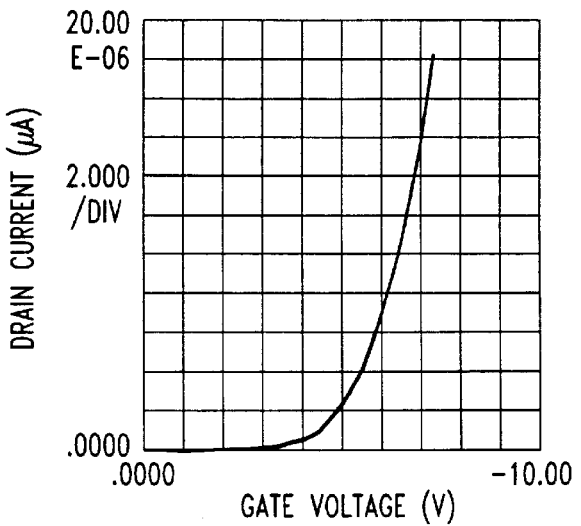
Figure 22:
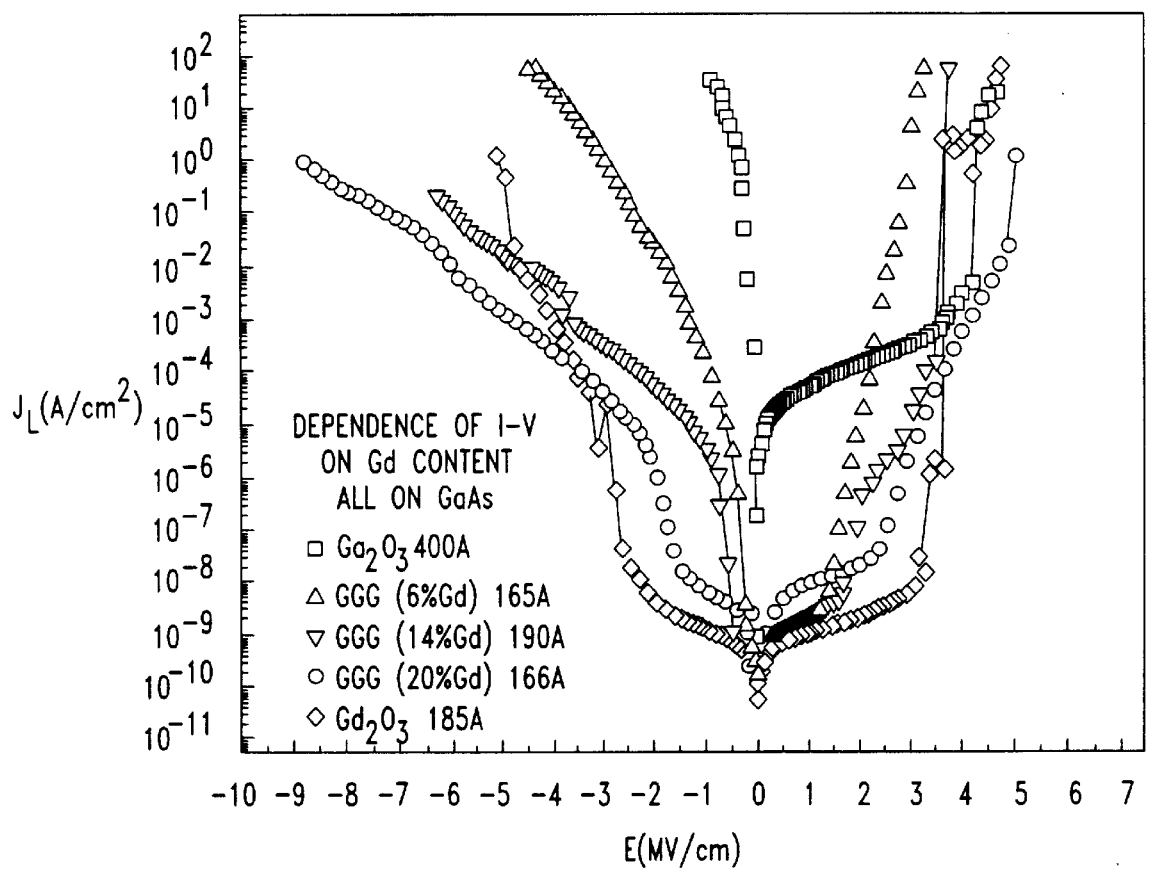
Figure 23:
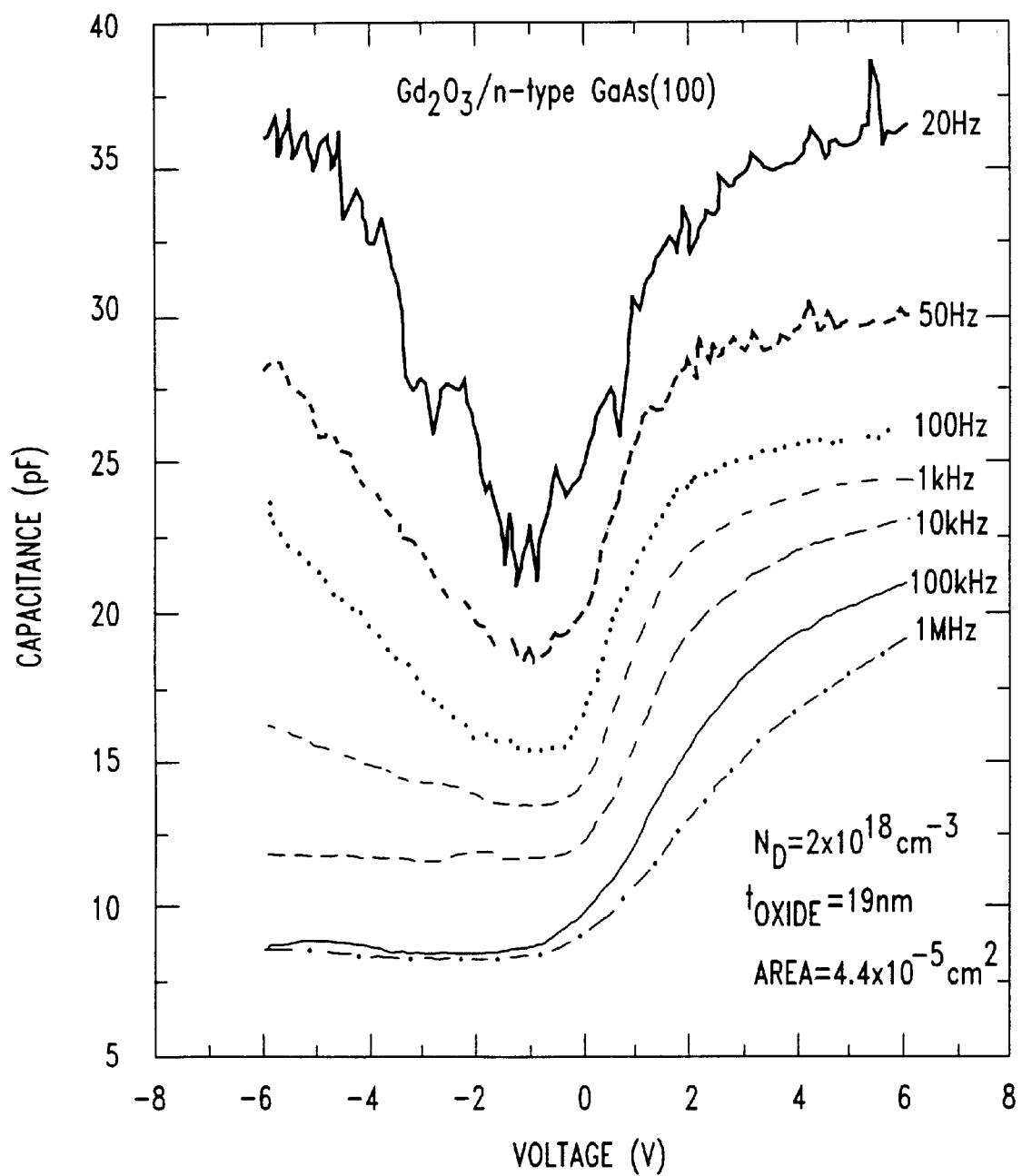
Figure 24:
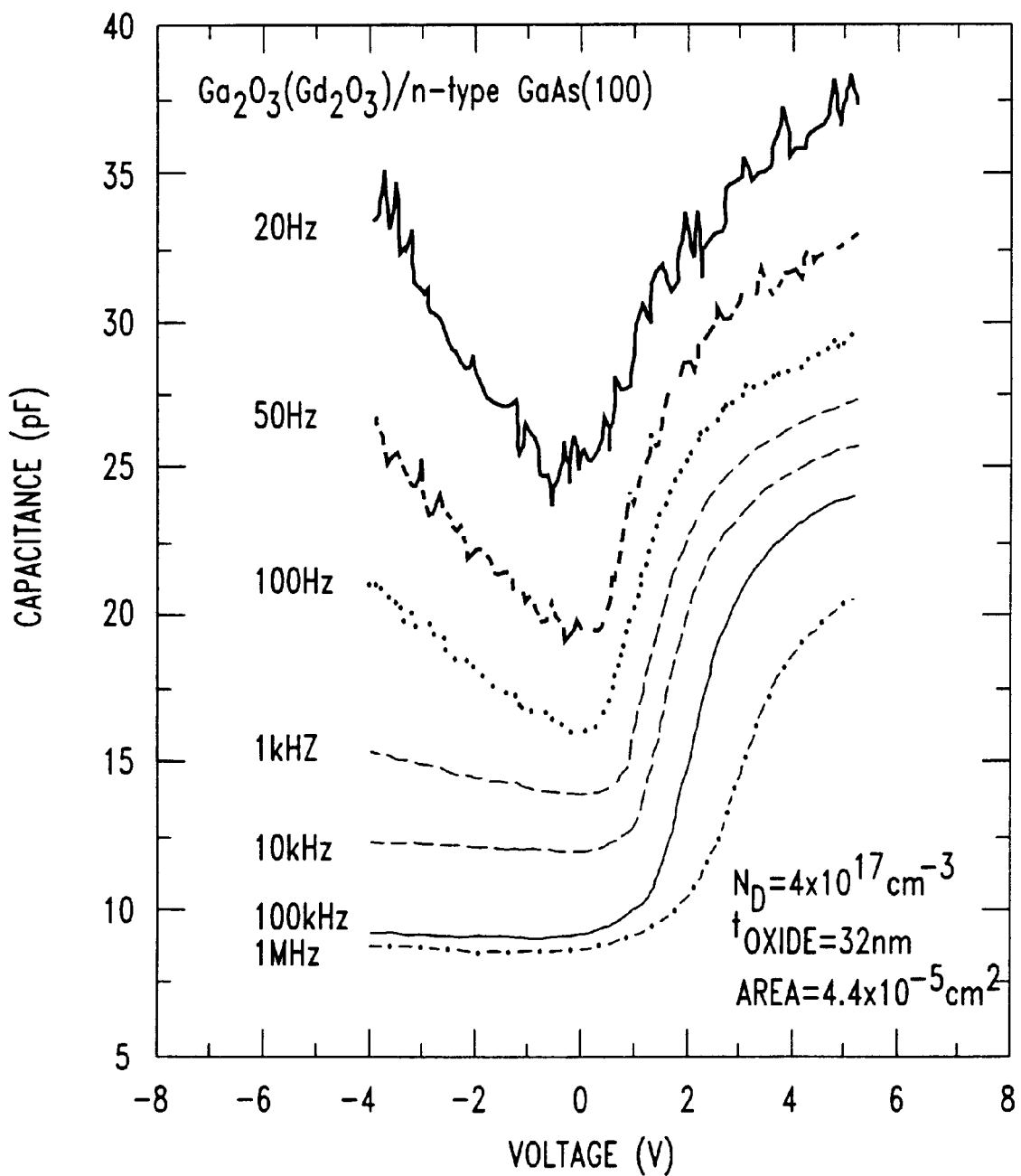

FIG. 8 presents exemplary data on capacitance vs. gate voltage of a MOS structure;

FIGS. 9–11 schematically depict exemplary devices, namely, a MOS-FET, a HBT and a solar cell, respectively;

FIG. 12 shows an exemplary embodiment of the process of making a GaAs IC;

FIGS. 13–17 schematically show an exemplary portion of a GaAs IC at various points of the manufacturing process;

FIG. 18 shows the diagram of an exemplary circuit comprising complementary MOS-FETs;

FIGS. 19–21 show electrical characteristics of an exemplary enhancement-mode p-channel GaAs MOS-FET; and FIGS. 22–24 show measurement data from GaAs/oxide/metal structures of various oxide compositions.

Like or analogous features generally are designated by the same numeral in different figures. The figures are not to scale.

DETAILED DESCRIPTION OF THE INVENTION

Figure 1:
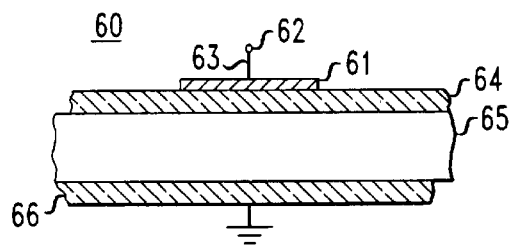
FIG. 1 is a schematic representation of a field effect device for inversion channel applications.

This disclosure exemplarily concerns III-V semiconductor electronic devices, especially field-effect devices for inversion channel applications and passivation of states on exposed surfaces of electronic devices. FIG. 1 is a schematic representation of a field effect device, 60, for inversion channel applications comprising means to apply a control voltage or bias to a metal field plate 61 including electrical terminal 62 and conductor 63. A dielectric thin film 64 comprises a uniform, homogeneous, dense, dielectric $Ga_2O_3$ layer deposited ex situ or in situ by electron-beam evaporation of a single crystal, high purity $Gd_3Ga_5O_{12}$ complex compound. The term in situ (in contrast to ex situ) exemplarily characterizes the deposition of said dielectric $Ga_2O_3$ thin film on a MBE grown semiconducting layer without leaving the UHV environment. The III-V semiconductor 65 is of weak n-type or of weak p-type for p-inversion channel and n-inversion channel applications, respectively. An ohmic contact 66 completes the circuit. The operation principles of such devices are well known from Si-MOSFET technology and consequently, are not discussed in detail (see, for example, S. M. Sze, "Physics of semiconductor devices", John Wiley & Sons, page 366, New York 1981).

Figure 2:
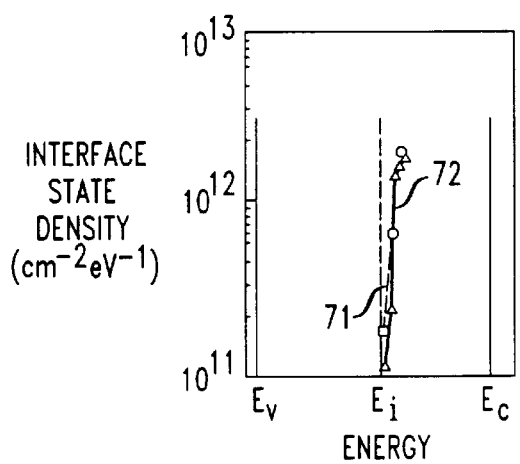
FIG. 2 is a plot of interface state density vs. bandgap energy of the field-effect device illustrated in FIG. 1, produced under one type of deposition parameters.
Figure 7:
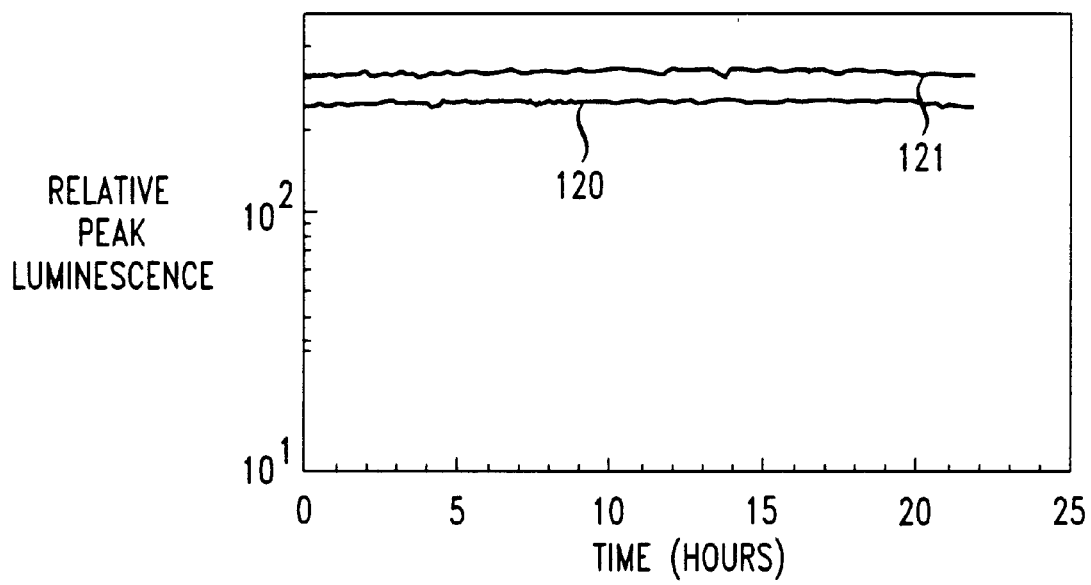

In a particular example, the $Ga_2O_3$ thin films were ex situ deposited on bare n-type GaAs substrates by the above described method of fabrication. The GaAs substrates were maintained during deposition at 350° C. with $O_2$ partial pressure of $2\times10^{-4}$ Torr in the evaporation chamber. The device was completed by fabricating Au/Ti dots 61 of different diameters (50, 100, 200, 500 μm) on top of $Ga_2O_3$ thin films 64 by evaporation through a shadow mask and by providing an Ohmic backside contact 66. High-frequency (1 MHz) capacitance/voltage measurements revealed an unpinned Fermi level below midgap, excellent reproducibility of flatband voltage and no detectable flatband voltage shift. Hysteresis was very small, typically a few tens of millivolts or less. FIG. 2 is a plot of corresponding interface state density vs. bandgap energy with substrate doping concentration of $1.6\times10^{16}$ cm$^{-3}$ (Curve 71), and $8.6\times10^{16}$ cm$^{-3}$ (Curve 72). Interface states $D_{it}$ were not detectable below midgap by high frequency measurements using Terman's method $$D_{it}(\psi_{so}) = \frac{C_i}{q^2}\left(\frac{dV^*}{d\psi_S} - \frac{dV}{d\psi_S}\right)_{\psi_S=\psi_{so}}$$

where $C_i$ is the capacitance of the dielectric layer per unit area, q is the unit charge, $V^*$ and V are the measured and calculated bias points, respectively, at the same semiconductor surface potential $\psi_s=\psi_{sO}$, i.e. at identical high frequency capacitances (T. M. Terman, "An investigation of surface states at a silicon/silicon oxide interface employing metal-oxide-silicon diodes", Solid-State Elect., Vol. 5, page 285 (1962)). The resolution limit of this method is about $10^{11}$ cm$^{-2}$eV$^{-1}$. The midgap interface state density determined from FIG. 7 is below $10^{12}$ cm$^{-2}$eV$^{-1}$.

Figure 3:
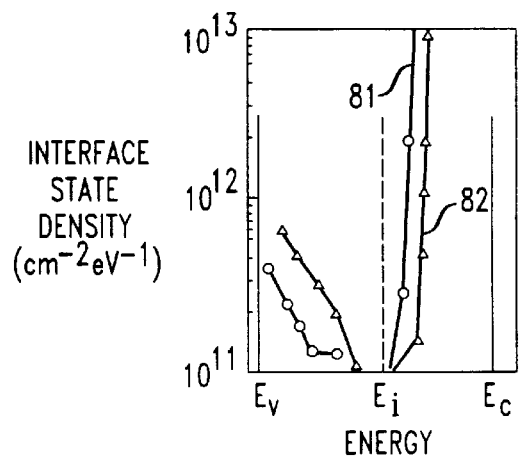
FIG. 3 is a plot of interface state density vs. bandgap energy of the field-effect device shown in FIG. 1, produced under different type of deposition parameters.

In another example, the $Ga_2O_3$ thin films were ex situ deposited on bare n-type $Ga_{0.5}In_{0.5}P$ substrates by the above described method of fabrication. The GaAs substrates were maintained during deposition at 125° C. with $O_2$ partial pressure of $2\times10^{-4}$ Torr in the evaporation chamber. Specific resistivity, dielectric constant and dc breakdown field of said $Ga_2O_3$ thin film are $4\times10^{12}$ Ωcm, 10.2, and 1.91 MV/cm. Frequency dispersion of capacitance was less than 5% below midgap within the measurement range between 500 Hz and 1 MHz. Again, high-frequency (1 MHz) capacitance voltage measurements revealed an unpinned Fermi level below midgap, excellent reproducibility of flatband voltage and no detectable flatband voltage shift. Hysteresis was very small, typically a few tens of millivolts or less. FIG. 3 is a plot of corresponding interface state density vs. bandgap energy with substrate doping concentration of $3\times10^{16}$ cm$^{-3}$ (Curve 81), and $3\times10^{17}$ cm$^{-3}$ (Curve 82). The midgap interface state density is well below $10^{11}$ cm$^{-2}$eV$^{-1}$ and the interface state density increases toward the valence band edge to values typically found at the excellent Si/SiO$_2$ interface.

As demonstrated in both examples, the disclosed field effect device meets all requirements such as unpinned Fermi level, very low density of interface states below midgap (p-inversion channel), excellent reproducibility of flatband voltage, no detectable flatband voltage shift, small hysteresis (typically a few tens of millivolts or less), and small frequency dispersion of capacitance between 500 Hz and 1 MHz (less than 5%) for inversion channel applications.

Further, Ga$_2$O$_3$ thin films deposited by said fabrication method are useful for passivation of states on exposed surfaces of any kind of electronic III-V devices. The interface recombination velocity is directly proportional to the midgap interface state density. Since the demonstrated midgap interface state density is below $10^{12}$ cm$^{-2}$eV$^{-1}$ and well below $10^{11}$ cm$^{-2}$eV$^{-1}$ at GaAs/Ga$_2$O$_3$ and Ga$_{0.5}$In$_{0.5}$P/Ga$_2$O$_3$ interfaces, respectively, the device performance and reliability are improved by small interface recombination velocities.

It has to be emphasized that many of the above-disclosed experimental conditions are exemplary only. For instance, single crystal Gd$_3$Ga$_5$O$_{12}$ is not the only possible source material, merely a convenient one that was readily available to us. As those skilled in the art well know, the chemical properties of the rare earths (atomic number 57-71) and Y closely resemble each other, and a source material in which Gd is completely or partially replaced by another rare earth or Y is likely to be useful in the practice of the invention. Furthermore, use of pure gallium oxide is contemplated, if the oxide becomes more readily available in pure crystalline form. Indeed use of a single crystal form is optional, provided the source material is sufficiently free of contaminants such as CO$_2$ and H$_2$O.

Furthermore, e-beam deposition is not the only possible deposition method. Indeed, any method (e.g., use of an effusion cell) that is compatible with maintenance of a clean, undamaged semiconductor surface is contemplated. Still furthermore, useful substrate temperatures are not limited to the range 40–370° C., and the background pressure is not limited to $1\times10^{-10}$ Torr and above. Indeed, we have discovered that maintenance of the atomically clean semiconductor surface at UHV pressure can result in substantial improvement in interface quality.

We have discovered that, by providing a substantially atomically clean (typically (100)-oriented) surface of a GaAs-based semiconductor body, and by appropriately limiting exposure of the surface to oxygen and other contaminants prior to completion of the first monolayer of dielectric material on the surface, GaAs-based semiconductor/Ga$_2$O$_3$ layer structures having greatly improved interface characteristics can be produced. According to our present understanding, the exposure of the surface to impurities is such that, at $t_m$, impurity coverage of the surface is less than 1% of a monolayer, exemplarily such that the exposure of the surface to impurities is at most 100 Langmuirs (preferably less than 50 or 10 Langmuir). Our measurements to date have not revealed a significant difference in interface quality between structures that had exposures of 100 Langmuirs and 10 Langmuirs, respectively, although the existence of a difference cannot be ruled out. However, we expect that exposure substantially in excess of 100 Langmuirs will result in reduced quality interfaces.

Although in principle any apparatus that can provide the substantially atomically clean surface at $t=t_c$, and the required low exposure during the time from $t_c$ to $t_m$ is potentially suitable for the practice of the invention, in practice the apparatus typically will comprise one or more UHV chambers. In the case of multichamber apparatus, two chambers will generally be linked together by a transfer module which facilitates transfer of the semiconductor body from one chamber to the other without exposure of the body to the ambient atmosphere. Typically the transfer is under UHV conditions. Such apparatus is known. See, for instance, M. Hong et al., *J. Electronic Materials*, Vol. 23, 625 (1994).

Exemplarily, our apparatus comprises a MBE growth chamber (background pressure typically about $2\times10^{-11}$ Torr), a dielectric film deposition chamber (typically about $1\times10^{-10}$ Torr), and a transfer module (typically about $6\times10^{-11}$ Torr) that links the former chambers.

In an exemplary embodiment of the inventive method, a conventional (100)-oriented GaAs substrate was introduced into the MBE growth chamber, and a 1.5 μm thick GaAs n-type ($2\times10^{16}$ cm$^{-3}$) layer was grown by conventional MBE on the wafer. After completion of GaAs growth and cool-down, the wafer was transferred under UHV to the dielectric growth chamber. Following the transfer the wafer was heated in UHV to 400° C., and the dielectric layer deposited substantially as described above. During deposition the pressure in the chamber unavoidably increased to about $3\times10^{-7}$ Torr. According to our present understanding, the interface properties are substantially fixed as soon as the first monolayer of the dielectric has been deposited.

Figure 4:
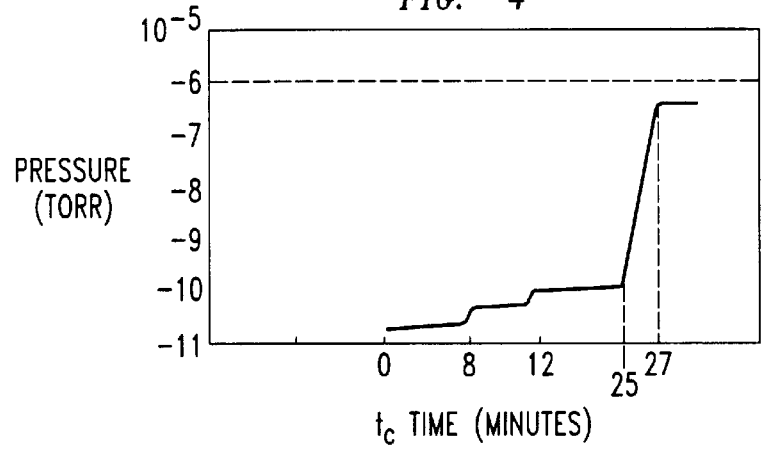
FIG. 4 shows exemplary data on vacuum pressure vs. time during the relevant portion of the process of forming a $Ga_2O_3$ layer on (100) GaAs.

FIG. 4 shows a schematic curve of pressure vs. time during manufacture in our apparatus of an exemplary GaAs/Ga$_2$O$_3$ structure according to the invention. The Ga$_2$O$_3$ growth rate was 0.016 nm/s. As can be readily verified, the total exposure was less than about 10 Langmuir. In FIG. 4, the time of completion of the substantially atomically clean (100)-oriented GaAs surface ($t_c$) is taken to correspond to the origin of the time axis. The period from t=0 to $t=t_m$ comprises the time (about 8 minutes) required for the wafer to cool from the GaAs deposition temperature (e.g., 600° C.) to about 200° C., the time (about 4 minutes) required to transfer the wafer in UHV from the GaAs deposition chamber to the Ga$_2$O$_3$ deposition chamber, and the time (about 13 minutes) to heat the wafer to the appropriate deposition temperature (e.g., 400° C.). As those skilled in the art will appreciate, the pressure in the chamber unavoidably rises during deposition above the background pressure. However, in our apparatus completion of the first monolayer of the oxide typically takes only a few seconds (the exact value depending on the deposition rate). During MBE deposition of the GaAs layer the O$_2$ pressure was below the detection limit, and the total background pressure was about $2\times10^{-11}$ Torr.

Figure 5:
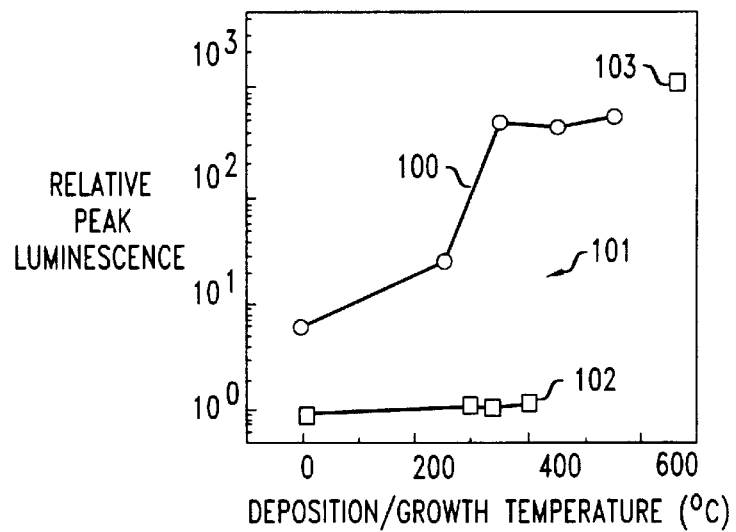
FIG. 5 shows exemplary comparative data on photoluminescence vs. deposition temperature.

FIG. 5 shows exemplary data (curve 100 and data point 101) on relative peak luminescence vs. dielectric growth temperature for GaAs/Ga$_2$O$_3$ interfaces according to the invention, as well as analogous comparison data for an exemplary GaAs/MgO interface (curve 102) and for a GaAs/AlGaAs interface (data point 103). The latter interface had a measured interface state density of $2\times10^9$/cm$^2$eV, and had peak luminescence only marginally larger than that of some GaAs/Ga$_2$O$_3$ interfaces according to the invention, indicative of the low value (e.g., <10$^{11}$/cm$^2$.eV for deposition temperature>200° C.) of interface state density obtainable by the method according to the invention. The low values of interface state density are indicative of low values (e.g., 10$^3$–10$^4$ cm/s) of recombination velocity, as those skilled in the art will appreciate.

Curve 100 refers to As-stablized C(2×4) GaAs surfaces, whereas data point 101 refers to a Ga-stabilized C(4×2) GaAs surface. The data illustrates the typically substantially higher quality of As-stabilized (100) GaAs/Ga$_2$O$_3$ interfaces, as compared to analogous Ga-stabilized interfaces. Consequently, currently preferred embodiments of the method comprise As-stabilization of the GaAs surface. Exemplarily, this is done by maintaining the As flux after termination of the Ga flux until the sample has cooled to 500° C., and turning the sample surface. The luminescence was excited by laser radiation (λ=514.5 nm, power density 50 W/cm$^2$).

Figure 6:
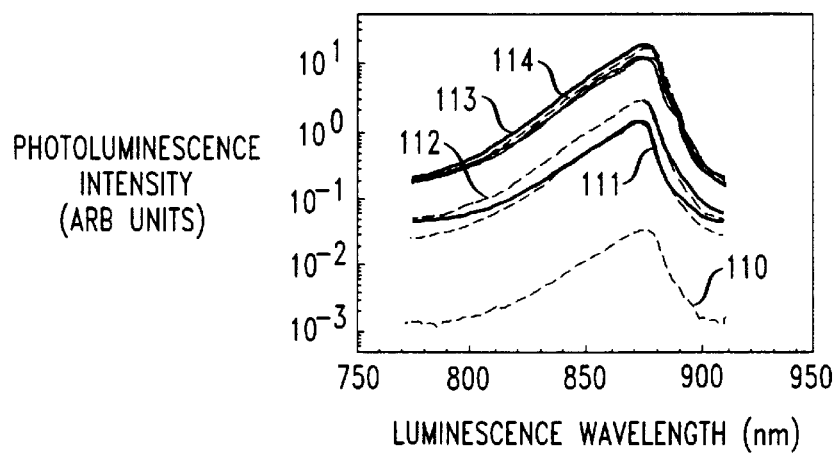
FIGS. 6 and 7 shows photoluminescence data that illustrate, respectively, the thermochemical and photochemical stability of interfaces.

FIG. 6 shows exemplary photoluminescence data that demonstrates the surprisingly high thermochemical stability of GaAs/Ga$_2$O$_3$ interfaces according to the invention. Curve 110 was obtained from bare GaAs and is provided for comparison purposes. The remaining curves were obtained from (100) GaAs/Ga$_2$O$_3$ structures according to the invention that were annealed for 120 seconds in forming gas. The structures were substantially identical, all having a 26.2 nm SiO$_2$ cap layer for purposes of the annealing experiment. The parameter that distinguishes curves in FIG. 6 is the annealing temperature. Curves 111 pertain to 800 and 900° C., 112 to 750 and 1000° C., 113 to 700° C., 114 to 650° C., with the remaining curves (which are almost identical) pertaining to 400, 500, 550 and 600° C., and to an as-deposited structure.

FIG. 7 shows exemplary photoluminescence data that demonstrates the photochemical stability of an exemplary GaAs/Ga$_2$O$_3$ interface according to the invention. Curve 120 pertains to a structure that was annealed at 1000° C. for 30 seconds in forming gas, and curve 121 pertains to an analogous as-deposited structure.

FIG. 8 presents exemplary capacitance vs. gate voltage data for a MOS structure, with curve 130 showing the quasi-static response, and curve 131 showing the high frequency (100 kHz and 1 MHz) response. The oxide thickness was 46 nm, the contact size was 2×10$^{-3}$ cm$^2$, the semiconductor was n-type (2×10$^{16}$ cm$^{-3}$), and the sweep rate was 100 mV/s. As those skilled in the art will recognize, the data of FIG. 8 demonstrates the existence of inversion as well as of accumulation. The existence of frequency dispersion of the Ga$_2$O$_3$ dielectric constant should be noted.

FIG. 9 schematically depicts an exemplary electronic device, namely, a GaAs-based MOS-FET. Numerals 140–147 refer, respectively, to the GaAs body (exemplarily p-type), the source region (exemplarily n-type), the drain region (exemplarily n-type), the drain contact, the source contact, the Ga$_2$O$_3$ gate oxide, the gate contact and the field oxide (optionally also Ga$_2$O$_3$). Associated with the interface between 140 and 145 is an interface state density <10$^{11}$/cm$^2$.eV, and typically a recombination velocity <10$^4$ cm/s.

FIG. 10 schematically depicts another exemplary electronic device, namely, a GaAs-based HBT. Numerals 150–158 refer, respectively, to the collector contact, the GaAs substrate (typically n$^+$), the GaAs collector layer (typically n$^-$), the GaAs base layer (typically p$^+$), the emitter layer (exemplarily n-type graded AlGaAs), the emitter contact layer (exemplarily n$^+$ AlGaAs), the base contact, the emitter contact and the Ga$_2$O$_3$ passivation layer. Associated with the interface between the semiconductor material and oxide layer 158 are the above specified characteristics.

FIG. 11 schematically depicts an exemplary optoelectronic device, namely, a GaAs-based solar cell with Ga$_2$O$_3$ antireflection coating. Numerals 160–166 refer, respectively, to the substrate (e.g., GaAs), an n-GaAs layer, a p-GaAs layer, a p$^+$-AlGaAs layer, a p$^+$GaAs contact layer, a metallization layer, and Ga$_2$O$_3$ AR layer. The interface between 163 and 166 has the above specified characteristics.

Those skilled in the art will appreciate that in general devices according to the invention are structurally similar or identical to the corresponding (existing or proposed) prior art structures. However, due to the presence of the high quality GaAs/Ga$_2$O$_3$ interface that can be produced by the inventive method, these devices will have substantially improved characteristics. For instance, in a HBT according to the invention the presence of the improved Ga$_2$O$_3$ passivation layer will result in significantly reduced recombination in the extrinsic base region, with attendant improvement in device characteristics.

Analysis of GaAs/Ga$_2$O$_3$ structures according to the invention that comprise a dielectric layer deposited as described above (i.e., using a Gd$_3$Ga$_5$O$_{12}$ source) has revealed the presence of a significant amount of Gd in the dielectric layer. The Gd concentration is typically highest at or near the surface of the dielectric layer, but is substantially (e.g., by up to three orders of magnitude) less close to the semiconductor/dielectric interface. Due to experimental limitations the dielectric composition directly at the interface has not been determined, but is expected to be essentially pure Ga$_2$O$_3$, with at most about 100 ppm of Gd.

FIG. 12 shows in flow chart form a MOS-FET manufacturing process, and FIGS. 13–17 schematically depict various steps of device processing.

Steps A and B of FIG. 12 respectively require provision of a GaAs substrate and formation of a patterned implant mask. The substrate typically is a conventional semi-insulating GaAs wafer, but could be such a wafer with one or more epitaxial layers thereon. For the sake of concreteness, the discussion below will be in terms of a conventional (100) semi-insulating GaAs substrate.

Formation of a patterned implant mask exemplarily involves deposition of a thin layer of dielectric material (e.g., SiO$_2$, SiN$_x$, SiO$_x$N$_y$, exemplarily 40–200 nm thick) on the major surface of the substrate, deposition of a conventional photoresist layer on the dielectric layer, and patterning of the photoresist layer such that appropriate windows are formed through the photoresist to the dielectric. This is followed by ion implantation (see step C) into the GaAs material that underlies the windows. Steps B and C will typically be repeated one or more times, to attain the dopant distribution shown in FIG. 13. Provision of the dielectric layer is optional but preferred.

Figure 13:
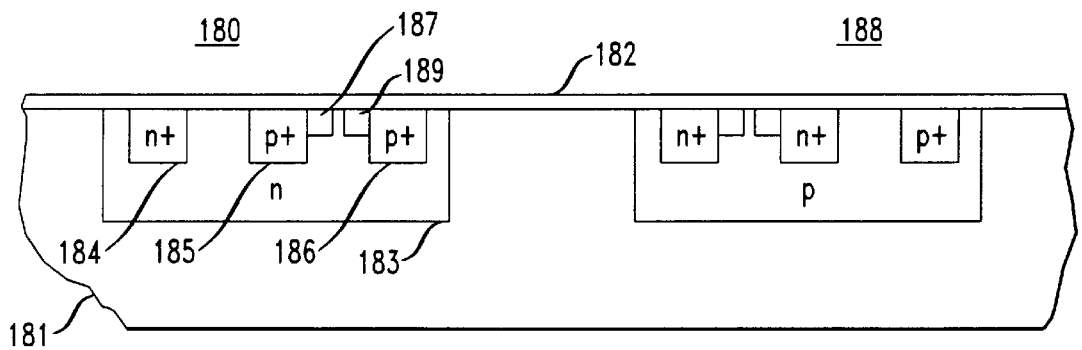

FIG. 13 shows semi-insulating GaAs substrate 181 and dielectric layer 182. Implanted regions are shown, the implants selected to facilitate formation of a p-MOS-FET 180 and a n-MOS-FET 188. Only the steps leading to formation of the p-MOS-FET will be discussed in detail, since those leading to the n-MOS-FET are either identical or are obvious variations, e.g., substitution of a p-implant for an n-implant.

Exemplarily, n-type region 183 is formed by implantation of Si or S through dielectric layer 182 in photoresist-defined areas of the wafer. After removal of the photoresist mask, a new mask for implantation of additional Si or S into channel contact 184 is provided, and the n$^+$ channel contact is formed. This is followed by formation (by Be or Zn implantation) of p+ source 185 and p+ drain 186. This in turn is optionally followed by formation (by ion implantation) of p source and drain regions 187 and 189, respectively.

Step D of FIG. 12 involves annealing of the ion implanted substrate under conditions effective for activating the implanted ions, with or without dielectric layer 182 on the substrate. With retained dielectric layer the implant activation anneal exemplarily is accomplished in rapid thermal anneal (RTA) apparatus, typically at a temperature in the range 780–860° C. for a time in the range 2–5 minutes. Alternatively and preferably, the dielectric layer is removed (e.g., with HF), and the wafer is heated in an evacuable reactor to a temperature in the above range, with the wafer in contact with an As-containing atmosphere. Exemplarily, when the wafer reached 300° C., the wafer was maintained at that temperature for 5 minutes under flowing $H_2$, followed by heating to 825° C. under $H_2$ and $AsH_3$ ($H_2$:$AsH_3$ flow 70:1). The wafer was maintained at 825° C. for 5 minutes, followed by cooling to room temperature. As an alternative to the use of $H_2$+arsine, elemental arsenic vapor could be used. Desirably the atmosphere contains enough As or As-containing species (e.g., arsine) to prevent net loss of As from the substrate surface. The required partial pressure of As or As-containing species depends inter alia on the annealing temperature, and thus cannot be specified in generality. However, a minor amount of experimentation will typically suffice to determine appropriate conditions. Exemplarily, we have achieved substantially 100% activation of implanted Be, with essentially no net loss of As from the wafer surface, when annealing the wafer at 825° C. for 5 minutes under 45 Torr of arsine and $H_2$ (about 1:70 flow rate ratio).

Figure 14:
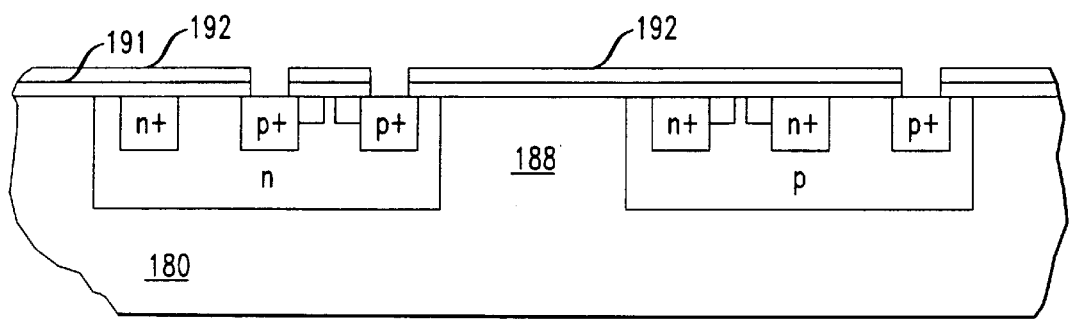
Figure 15:
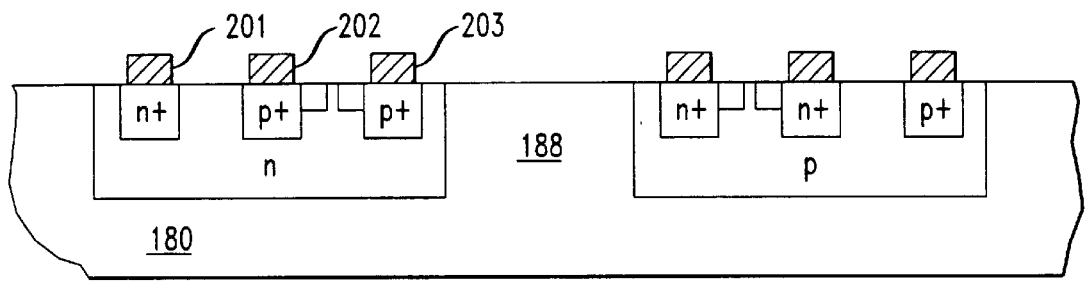

Step E of FIG. 12 typically involves formation of a dielectric layer (exemplarily about 200 nm of $SiO_2$) on the wafer surface, followed by formation of an appropriately patterned photoresist layer that has windows for channel contact, source contact and drain content. In the window regions, the dielectric material is removed by conventional etch, e.g., with HF. In FIG. 14, numeral 191 refers to the dielectric layer, and 192 to the photoresist.

Step E of FIG. 12 further comprises deposition of ohmic contacts. For instance, p-contact metal (exemplarily 25 nm AuBe/200 nm Au) is deposited by e-beam deposition and sputtering. After lift-off of the photoresist, a new photoresist layer is deposited and patterned for n-contact metallization, using, for instance, 5 nm Ni/5 nm Ge/10 nm AuGe/20 nm Mo/200 nm Au). FIG. 20 shows the result of the metallization, wherein numeral 201 refers to the n-contact metal of the channel contact, and numerals 202 and 203 refer to the p-contact metal of the source and drain contact, respectively.

Ohmic contact deposition prior to gate oxide formation is not a requirement, and the deposition could be performed subsequent to gate oxide formation.

Step F of FIG. 12 involves removal of native oxides (and possibly other contaminants) from the wafer surface. The removal has to be carried out such that an essentially atomically clean, essentially atomically ordered, surface results. Creation of such a "reconstructed" surface is an important aspect of the process according to the invention. It can be accomplished in any appropriate manner, and will typically be carried out under high vacuum (e.g., pressure $\leq 10^{-8}$ Torr). Among currently preferred techniques for producing a reconstructed GaAs surface are thermal desorption (e.g., 5 minutes at 580° C., As overpressure at $10^{-6}$ Torr to protect the wafer surface), and low damage dry etching techniques such as ECR with $H_2$ plasma or atomic hydrogen.

The meaning of "essentially atomically clean" and "essentially atomically ordered" is as defined above.

After completion of surface reconstruction, the gate oxide layer is formed (step G of FIG. 12) in situ on the reconstructed surface, i.e., without removal of the wafer from the high vacuum, exemplarily as described in the above cited paper by Hong et al. Not only is the oxide layer grown in situ, but the time between completion of surface reconstruction and commencement of oxide deposition is desirably kept to a minimum, in order to avoid significant (e.g., in excess of 100 Langmuirs) contamination of the surface.

The oxide layer thickness will typically be in the approximate range 5–150 nm, and the layer will have overall composition $Ga_xA_yO_z$ where $x \geq o$, and the other symbols are as defined below.

Exemplarily the wafer is maintained at a temperature of at most 580° C. under arsenic overpressure (e.g., $10^{-6}$ Torr As) during gate oxide deposition. The oxide typically is deposited substantially uniformly over the whole wafer surface, but deposition could, at least in principle, be limited to particular portions of the surface, these portions including the gate region between source and drain of at least one MOS-FET.

Figure 16:
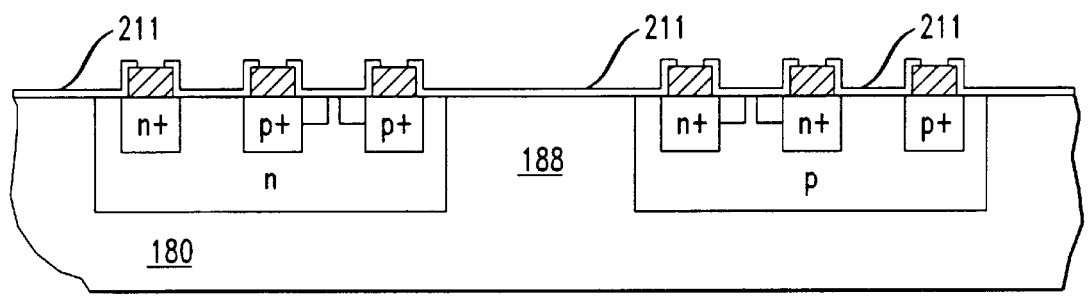

Subsequent to gate oxide deposition, the oxide is patterned to expose the previously formed channel, source and drain contacts of the MOS-FETs, as indicated by step H of FIG. 12. The patterning can be done using conventional photolithography and etching, e.g., in HCl solution. FIG. 16 schematically shows two devices after gate oxide patterning, with numeral 211 referring to the patterned gate oxide.

Figure 17:
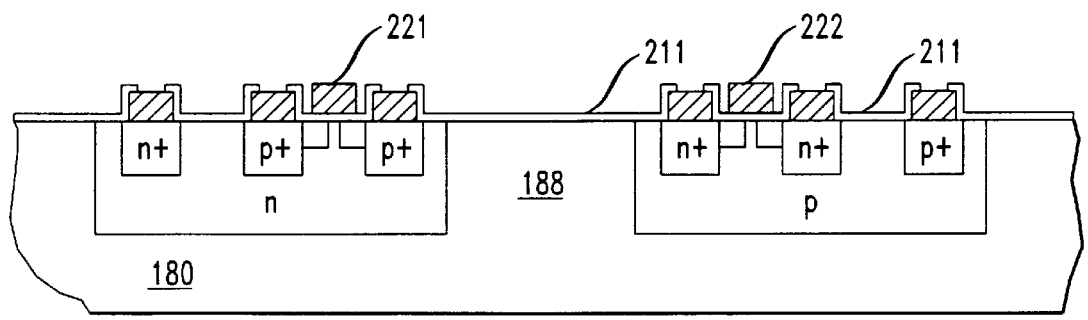

Patterning of the gate oxide layer is followed by gate metallization, also per step H of FIG. 12. This can be conventional, involving for instance e-beam deposition of 25 mm Ti/50 nm Pt/300 nm Au, and lift-off. Typically this step can also include formation of interconnections, including providing connections (not shown in FIG. 17) to channel, source, drain and gate contacts of the various MOS-FETs. In FIG. 17, numerals 221 and 222 refer to the gate contact of the p-MOS-FET and n-MOS-FET, respectively.

Step I of FIG. 12 refers to a variety of, typically conventional, steps that will typically be required to complete an IC according to the invention, e.g., testing, dicing of the wafer into chips, wire bonding, encapsulation, etc.

The thus produced MOS-FET desirably will be electrically connected in conventional manner to other electronic devices, including other MOS-FETs, to form an integrated circuit. By way of example, the complementary MOS-FETs of FIG. 17 can be connected as shown in FIG. 18 to provide an inverter. In FIG. 18, numeral 231 refers to a n-channel enhancement mode GaAs MOS-FET substantially as shown in FIG. 17 and 232 refers to a p-channel enhancement mode GaAs MOS-FET, also substantially as shown in FIG. 17. The circuit per se is conventional, but the implementation in GaAs MOS-FET technology is novel, to the best of our knowledge. The combination of FIG. 18 is representative of circuits according to the invention.

As those skilled in the art will recognize, the above described process not only is suitable for producing GaAs-based planar n-channel and p-channel MOS-FETs on the same substrate, but can also be used to combine such MOS-FETs with GaAs (metal-semiconductor) MES-FETs. In order to produce a MES-FET, the gate oxide exemplarily is removed from the respective gate region, and an appropriate metal (e.g., Ti/Pt/Au) is deposited in the gate region to provide a Schottky barrier contact. GaAs-based MES-FETs are known and do not require detailed description.

However, the ability to integrate GaAs MES-FETs with GaAs MOS-FETs (including complementary enhancement type GaAs-MOSFETs) does, to the best of our knowledge, not exist in the prior art. Availability of this ability is expected to provide circuit designers with greater design freedom, and to lead to manufacture of a wide range of GaAs-based digital (but not excluding analog) ICs.

Some differences between prior art GaAs MOS-FETs and GaAs MOS-FETs according to the above description may bear further recitation. For instance, in some prior art devices the source and drain regions are connected by a channel of the same conductivity type as the regions. See, for instance, the above cited paper by Colquhoun et al. Such devices do not exhibit inversion in the channel.

Some devices require selective etching of the surface of the GaAs wafer, typically to form a notch in the surface to thereby reduce the channel width. See, for instance, the above cited paper by T. Mimura et al., FIGS. 7 and 8, and the Colquhoun et al. paper. No such etching is required for GaAs MOS-FETs according to the invention.

The above described embodiment is exemplary only, and variations can readily be devised, if desired. For instance, ohmic contacts can be formed after gate oxide deposition.

There are, however, non-optional features of the process which are currently deemed necessary for the production of GaAs-based MOS-FETs of acceptable characteristics. Among them are reconstruction of the relevant areas of the implanted wafer such that the surface areas are essentially atomically clean and ordered, in situ growth of the gate oxide on the reconstructed surface regions, and avoidance of any high temperature (typically >300° C. in air or >700° C. in UHV) treatment after surface reconstruction and gate oxide growth, unless a protective cap layer is provided to avoid surface and/or interface deterioration. See the previously cited paper by Passlack et al., *Appl. Phys. Lett.*, Vol. 69 (3), p. 302 ((July 1996). However, provision of a cap layer (e.g., a $SiO_2$ layer) over the gate oxide is not preferred. Thus, in preferred embodiments the method is carried out such that the device is, after gate oxide formation, not subjected to a temperature above about 300° C. in air, or $\geq$700° C. in UHV. A highly preferred feature is implant activation anneal in an As-containing atmosphere, with the partial pressure of As or As-containing species selected to prevent net loss of As from the surface.

MOS-FETs produced according to the invention have been tested in conventional fashion, and have been found to have excellent characteristics.

EXAMPLE 1

A p-MOS-FET was fabricated as follows. A conventional semi-insulating (100) oriented GaAs wafer (sheet resistivity about $10^8$ $\Omega$.cm) was provided. On the surface of the wafer was deposited, by conventional PECVD, a 50 nm layer of $SiO_2$. A 2.2 $\mu$m layer of conventional photoresist (AZ 1818) was formed on the $SiO_2$ layer and patterned to form an ion implantation mask, with a window through the mask that defined the n channel for the p-MOS-FET. Si ions were then implanted through the window (150 keV, $5 \times 10^{13}$ $cm^{-2}$). This first implantation was followed by further implantations to form the $n^+$ channel contact region, $p^+$ source and drain regions, and p low dose drain. Implant conditions were, respectively, as follows: 75 KeV, $6 \times 10^{13}$ $cm^{-2}$, Si; 30 KeV, $7 \times 10^{13}$ $cm^{-2}$, Be; and 25 KeV, $3 \times 10^{12}$ $cm^{-2}$, Be.

After implantation, the resist and $SiO_2$ were removed with acetone and HF (1:1 $HF:H_2O$), respectively. Implant activation was carried out in the reactor of a MOCVD system. The temperature of the wafer was raised, with $H_2$ admitted into the reactor when the wafer temperature had reached 300° C. The wafer was maintained under these conditions for 5 minutes, followed by admission of arsine and gradual raising of the temperature to 825° C., and maintenance of the wafer under these conditions for 5 minutes. The arsine: $H_2$ flow ratio and system pressure were 1:70 and 45 Torr, respectively.

After 5 minutes at 825° C. the wafer was allowed to cool to 450° C. under arsine/$H_2$, and then to room temperature under $H_2$, and transferred to a MBE system for surface reconstruction and gate oxide deposition. The wafer was mounted on a Mo block with indium and heated to 580° C. for 5 minutes to desorb surface contaminants such as native oxides. The background pressure in the reactor of the MBE system was $10^{-10}$ Torr, and an arsenic pressure of $10^{-6}$ Torr was maintained in the reactor to protect the wafer surface. RHEED was used to monitor the sample surface. The above described treatment resulted in an essentially atomically clean, atomically ordered wafer surface.

Upon completion of surface reconstruction, the wafer was transferred under UHV ($10^{-10}$ Torr) to a second chamber of the MBE system. A 40 nm layer of oxide was deposited over the wafer surface at a rate of about 0.02 nm/sec, substantially as described in the above cited paper by Hong et al. Briefly, the wafer was at 550° C., the background pressure in the chamber was less than $10^{-9}$ Torr, and the oxide was formed by e-beam evaporation.

After completion of gate oxide deposition and cooling of the wafer to room temperature, the ohmic contacts were defined. A conventional photoresist layer (AZ 1818) was applied and patterned in conventional manner such that the gate source and drain contact regions were exposed. The gate oxide was then removed from the exposed regions with 1:1 $HCl:H_2O$, and contact metal (25 nm AuBe/200 nm Au) was deposited by means of an e-beam deposition system. A conventional acetone lift-off technique was used to remove the undesired metallization. Finally, a 1.2 $\mu$m resist layer (AZ 1811) was applied and patterned, and used to define gate and final metal contacts at the same time. A Ti/Pt/Au layer (25 nm/50 nm/300 nm, respectively) was deposited by means of an e-beam deposition system. Unwanted metallization was removed with a conventional acetone lift-off technique, leaving channel, source, drain and gate contacts.

The thus produced device (40$\times$50 $\mu m^2$ gate geometry) was tested, and found to have the following characteristics:

As demonstrated by FIG. 19, the gate oxide had breakdown voltage of $3.6 \times 10^6$ Volt/cm. The transconductance was 0.3 mS/mm. FIG. 20 shows the drain I-V characteristics of the exemplary MOS-FET, and FIG. 21 shows drain current vs. gate voltage.

EXAMPLE 2

A pair of complementary MOS-FETs on a common substrate was produced substantially as described above, except that the ion implantation is modified to produce implanted regions substantially as shown in FIG. 18. The pair of MOS-FETs is connected as shown in FIG. 18 to form an inverter circuit. The circuit is tested and performs as expected.

EXAMPLE 3

A multiplicity of n-MOS-FETs, p-MOS-FETs and n- and p-MES-FETs are formed on a common substrate, substantially as described in Example 2, except that the gate oxide is removed from some of the n-type devices and some of the p-type devices, and 25 nm Ti/30 nm Pt/300 nm Au is deposited in the gate regions of these devices. After provision of conductive interconnects between the devices, the resulting circuit is tested and performs as expected.

It is apparent from the above description and from a variety of references (e.g., U.S. Pat. Nos. 5,550,089 and 5,597,768; M. Passlack et al., *Applied Physics Letters*, Vol. 69(3), pp. 302–304) that it is widely assumed in the art that e-beam evaporation from single crystal GGG (gadolinium gallium garnet; $Gd_3Ga_5O_{12}$) can result in the deposition of a thin film that is almost pure $Ga_2O_3$, with only a small amount (e.g., 0.1 at %) Gd also present in the film.

Furthermore, it is believed that the presence of the Gd is undesirable, and that ideally the film should be pure Ga oxide. See, for instance, U.S. Pat. No. 5,597,768, which discloses at col. 1, lines 39–45 that " . . . The major problem is that some of the $Gd_2O_3$ (about 0.1% according to the patent) is incorporated into the thin film as impurities creating defects and increasing the bulk trap density. The increased defects and, in turn, increased bulk trap density degrades the performance of the devices in which the thin film is used." In order to decrease the "impurity" level in the $Ga_2O_3$ thin film, the '768 patent teaches use of different evaporation source materials that "contain" $Ga_2O_3$ and another oxide having a melting temperature that is more than 700° C. above the sublimation temperature of $Ga_2O_3$. One such material is $MgGa_2O_4$, which is said to "contain" MgO and $Ga_2O_3$. The use of $MgGa_2O_4$ instead of GGG is said to result in " . . . drastically reduced incorporation of the undesired specie in the oxide film and in significantly lower bulk trap density in the oxide film." See col. 3, lines 18–21 of the '768 patent. However, the '768 patent does not provide any experimental data.

Our continued research (which included Rutherford Backscattering Spectrometry (RBS) and Auger analysis of very thin deposited films) now has yielded results that lead to a different approach to making a device-grade (e.g., interface state density in the $10^{10}$ $cm^{-2}eV^{-1}$ range or below, specifically, $1\times10^{11}$ $cm^{-2}eV^{-1}$ or below; with low leakage current and high breakdown voltage) thin oxide film on GaAs and GaAs-based semiconductor bodies.

We have found inter alia that, contrary to the teaching of the '768 patent, the oxide thin film desirably contains a substantial amount of Gd (or other appropriate metal element). Indeed, we have found that a film that is formed by evaporation from pure $Ga_2O_3$ powder (and thus is essentially pure Ga oxide) is generally not of device quality, whereas a film that is formed by evaporation from pure $Gd_2O_3$ (and thus is essentially pure Gd oxide) is generally of device quality, with low interface state density. This is exemplified by FIG. 22, which shows data on the I-V (current-voltage) characteristics of very thin oxide layers on GaAs, with a conventional metal contact defining the area of the MOS capacitor. As can be readily seen from FIG. 22, a 40 nm thick $Ga_2O_3$ film has essentially zero breakdown voltage for negative bias, with relatively high leakage for positive bias, and thus is unsuitable for most device applications, whereas a 18.5 nm thick $Gd_2O_3$ film conducts a mere $10^{-8}$ $A/cm^2$ at + or −3V. Films of intermediate composition (Gd content 6, 14 and 20% of the total metal content of the film) show intermediate breakdown voltages.

We have found that a thin oxide film that is formed by in situ co-evaporation from two separate sources, e.g., one using $Ga_2O_3$ powder and the other $Gd_2O_3$ powder, generally will be of device quality, provided the evaporation rates are selected such that the content of Gd (or other appropriate metal element) is at least about 10 atomic % of the total metal content, preferably at least 20 atomic %.

It will be understood that the GaAs substrates were prepared as described above (resulting in an essentially atomically clean and atomically ordered surface), with the evaporations carried out in situ, without exposure of the samples to the atmosphere.

The above described experimental facts are consistent with the requirement that in mixed oxide films (of overall composition $Ga_xA_yO_z$, with A, x, y and z as defined below) the Ga ions are caused to be in their 3+ oxidation state. This is facilitated through appropriate choice of stabilizer element and oxygen content.

It is known that Ga can exist in the 1+, 2+ and 3+ oxidation states, and that there are electro-positive elements (to be termed "stabilizers") that can stabilize Ga in the 3+ state. Among the stabilizers for Ga is Gd, having Pauling electronegativity 1.1. Among other possible stabilizers for Ga are Sc, Y, the other rare earths, the alkaline earths and the alkalis. In addition to provision of a stabilizer element for Ga, it is also required that sufficient oxygen be present in the deposited film to satisfy the requirement that Ga and the stabilizer element are substantially fully oxidized.

The above exposition is for tutorial purposes only, and is not intended to limit the scope of the invention.

In exemplary embodiments of the invention the oxide film is formed by deposition from 2 (or more) separate deposition sources (e.g., e-beam evaporation sources), with the deposition parameters selected such that the resulting film has overall composition $Ga_xA_yO_z$, where A is one or more electropositive stabilizer element for stabilizing Ga in the 3+ oxidation state, and x>0. Furthermore, y/(x+y) is greater than or equal to 0.1, preferably $\geq 0.2$, and z is selected to satisfy the requirement that both Ga and A are substantially fully oxidized.

In other exemplary embodiments, the oxide film is formed by deposition of A-oxide, without deposition of Ga-oxide. The film thus has overall composition $AO_z$, with z selected such that A is substantially fully oxidized.

By way of example (for both x=0 and x>0), A is selected from the group consisting of Sc, Y, the rare earth metals (atomic number 57-71), the alkaline earths (e.g., Be, Mg, Ca, Sr, Ba), and the alkalis (e.g., Li, Na, K, Rb, Cs).

The alkali elements generally are not preferred, due to their relative instability to moisture and incompatibility with semiconductor device processing conditions. The currently preferred stabilizer elements are Sc, Y the rare earths (atomic number 57-71) and the alkaline earths, with Sc, Y, La, Nd, Gd, Dy, Ho, Er and Lu being currently most preferred.

It will be understood that the requirement that, in mixed oxide films, Ga (and A) are substantially fully oxidized does not mean that 100% of all Ga ions have to be in the 3+ ionization state. Typically acceptable results are obtained if 80% or more of all Ga is in the 3+ state, with 80% or more of A also being fully oxidized.

It will also be understood that a mixed oxide of composition $Ga_xA_yO_z$ is not necessarily a homogeneous material of that composition. Presently it can not be ruled out that the material contains microscopic regions of Ga-oxide as well as microscopic regions of A-oxide.

FIG. 23 shows C-V (capacitance-voltage) data for a 19 nm thick film of $Gd_2O_3$ on n-type ($2\times10^{18}$ $cm^{-3}$) GaAs of (100) orientation. The area of the MOS capacitor was $4.4\times10^{-5}$ $cm^2$. FIG. 23 clearly shows accumulation and inversion at low frequency. The data establishes the suitability of the oxide film for device applications, including for MOS-FETs.

FIG. 24 shows similar data for a 32 nm thick Ga- and Gd-containing mixed oxide film, with about 22% of the total metal content being Gd. The data also shows accumulation and inversion, substantially as the data of FIG. 23.

In an exemplary preferred embodiment the article comprises a planar enhancement mode MOS-FET with inversion channel.

EXAMPLE 4

A MOS-FET is fabricated substantially as disclosed in Example 1, except that a Gd- and Ga-containing oxide film is deposited by simultaneous e-beam evaporation from a source containing $Ga_2O_3$ powder and a source containing $Gd_2O_3$ powder, with the evaporation rates selected to yield a film having Gd~22% of the total metal content. The MOS-FET performs substantially as the device of Example 1.

EXAMPLE 5

A MOS-FET is fabricated substantially as in Example 4, except that the oxide film is $Gd_2O_3$. The MOS-FET performs substantially as the device of Example 4.

The invention claimed is:

1. An article comprising a GaAs-based field effect transistor comprising an oxide layer on a GaAs-based semiconductor body and forming an interface therewith, and further comprising a metal contact disposed on each of the oxide layer and the semiconductor body, associated with the interface being a midgap interface state density of at most $1 \times 10^{11}$ cm$^{-2}$ eV$^{-1}$ at 20° C.;

CHARACTERIZED IN THAT the oxide layer has overall composition $Ga_xA_yO_z$, where Ga substantially is in a 3+ oxidation state, A is one or more electropositive stabilizer elements adapted for stabilizing Ga in the 3+ oxidation state, x is greater than or equal to zero, z is selected to satisfy the requirement that both Ga and A are substantially fully oxidized, and y/(x+y) is greater than 0.1.

2. Article according to claim 1, wherein x=0 and more than 80% of A is fully oxidized, or x>0 and more than 80% of each of Ga and A is fully oxidized.

3. Article according to claim 1, wherein A is selected from the group consisting of Sc, Y, the rare earth elements and the alkaline earth elements.

4. Article according to claim 3, wherein A is selected from the group consisting of Sc, Y, La, Nd, Gd, Dy, Ho, Er and Lu.

5. Article according to claim 4, wherein A is Gd.

6. Article according to claim 1, wherein x=0 and at least 90% of A is fully oxidized.

7. Article according to claim 1, wherein x>0, y/(x+y) is at least 0.2, and at least 90% of each of Ga and A is fully oxidized.

8. Article according to claim 1, wherein the GaAs-based semiconductor body is a GaAs body.

9. Article according to claim 1, wherein the article comprises a planar enhancement mode MOS-FET with inversion channel.

* * * * *